(12) United States Patent
Mazumder

(10) Patent No.: US 9,601,170 B1
(45) Date of Patent: Mar. 21, 2017

(54) APPARATUSES AND METHODS FOR ADJUSTING A DELAY OF A COMMAND SIGNAL PATH

(71) Applicant: Micron Technology, Inc., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/139,120

(22) Filed: Apr. 26, 2016

(51) Int. Cl.
G11C 7/10 (2006.01)
G11C 7/22 (2006.01)
G11C 8/10 (2006.01)
G11C 8/18 (2006.01)
G11C 7/08 (2006.01)

(52) U.S. Cl.
CPC .......... G11C 7/1093 (2013.01); G11C 7/1084 (2013.01); G11C 7/1087 (2013.01); G11C 7/222 (2013.01); G11C 8/10 (2013.01); G11C 8/18 (2013.01); G11C 7/08 (2013.01); G11C 7/22 (2013.01)

(58) Field of Classification Search
CPC .............. G11C 7/22; G11C 7/222; G11C 7/08
USPC ............ 365/191, 194, 233.1, 233.11, 233.12
See application file for complete search history.

(56) References Cited

U.S. PATENT DOCUMENTS

| 5,004,933 | A | 4/1991 | Widener |
| 6,111,810 | A | 8/2000 | Fujita |
| 6,219,384 | B1 | 4/2001 | Kliza et al. |
| 6,260,128 | B1 | 7/2001 | Ohshima et al. |
| 6,275,077 | B1 | 8/2001 | Tobin et al. |
| 6,327,318 | B1 | 12/2001 | Bhullar et al. |
| 6,424,592 | B1 | 7/2002 | Maruyama |
| 6,438,055 | B1 | 8/2002 | Taguchi et al. |
| 6,459,313 | B1 | 10/2002 | Godbee et al. |
| 6,489,823 | B2 | 12/2002 | Iwamoto |
| 6,510,095 | B1 | 1/2003 | Matsuzaki et al. |
| 6,636,110 | B1 | 10/2003 | Ooishi et al. |
| 6,687,185 | B1 | 2/2004 | Keeth et al. |
| 6,710,726 | B2 | 3/2004 | Kim et al. |

(Continued)

FOREIGN PATENT DOCUMENTS

| CN | 101752009 A | 6/2010 |
| JP | 2013-222997 A | 10/2013 |
| TW | 201303735 | 1/2013 |

OTHER PUBLICATIONS

"Interfacing DDR SDRAM with Stratix II Devices", Version 3.2, Altera Corp, Sep. 2008.

(Continued)

*Primary Examiner* — Ly D Pham
(74) *Attorney, Agent, or Firm* — Dorsey & Whitney LLP

(57) ABSTRACT

Apparatuses and methods related to adjusting a delay of a command signal path are disclosed. An example apparatus includes: a command input buffer that receives command signals and further provides buffered command signals; a command decoder coupled to the command input buffer, that decodes the buffered command signals responsive to a first clock signal and further provides a decoded command signal; and a command extension circuit coupled to the command decoder, which receives the decoded command signal, the first clock signal and a second clock signal having a first delay relative to the first clock signal, and further provides a command extension signal having a pulse width longer than the pulse width of the decoded command signal.

20 Claims, 4 Drawing Sheets

(56) References Cited

U.S. PATENT DOCUMENTS

| | | |
|---|---|---|
| 6,744,285 B2 | 6/2004 | Mangum et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,580,321 B2 | 8/2009 | Fujisawa et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,732,509 B2 | 5/2014 | Kwak |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 2001/0015924 A1 | 8/2001 | Arimoto et al. |
| 2002/0057624 A1 | 5/2002 | Manning |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250883 A1 | 11/2006 | Szczypinski |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1 | 7/2008 | Mai |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0327926 A1 | 12/2010 | Takahashi |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0102039 A1 | 5/2011 | Shin |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002320 A1 | 1/2013 | Lin et al. |
| 2013/0141994 A1 | 6/2013 | Ito et al. |
| 2013/0194013 A1 | 8/2013 | Kwak et al. |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |

(56) References Cited

U.S. PATENT DOCUMENTS

2014/0258764 A1  9/2014  Kwak
2014/0293719 A1  10/2014 Jung
2015/0156009 A1  6/2015  Bogdan
2015/0170725 A1  6/2015  Kwak
2015/0235691 A1  8/2015  Kwak
2015/0340072 A1  11/2015 Mazumder
2016/0056807 A1  2/2016  Neidengard et al.

OTHER PUBLICATIONS

Lee, , "How to Implement DDR SGRAM in Graphic System", Samsung Electric, 4Q1998.
U.S. Appl. No. 14/698,550, entitled "Methods and Apparatuses Including Command Latency Control Circuit", filed Apr. 28, 2015.
U.S. Appl. No. 15/139,102, entitled "Methods and Apparatuses Including Command Delay Adjustment Circuit", filed Apr. 26, 2016.

APPARATUSES AND METHODS FOR ADJUSTING A DELAY OF A COMMAND SIGNAL PATH

TECHNICAL FIELD

Embodiments of the invention relate generally to semiconductor memory, and more specifically, in one or more described embodiments, to signal paths and adjusting the timing of command signals through the signal path.

BACKGROUND OF THE INVENTION

In semiconductor memory, proper operation of the memory is based on the correct timing of various internal command and clock signals. For example, in reading data from the memory, internal clock signals that clock data path circuitry to provide (e.g. output) the read data may need to be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to memory internal clock signals that clock data path circuitry to latch write data may need to be provided with specific timing relationships with internal write command signals to properly enable the data path circuitry to provide the latched write data for writing to memory. Inaccurate timing of the internal command and clock signals could result in the write command being inadvertently ignored or incorrect write data being provided to the memory may (e.g., the write data is associated with another write command). Another example of a command that may require the correct timing of internal clock signals and the command for proper operation include, for example, on-die termination enable commands.

Moreover, as known, a "latency" may be selected (e.g., programmed, desired, used, given, etc.) to set a time, typically in numbers of clock periods T, between receipt of a read command by the memory and when the data is output by the memory. A "write latency" may also be selected to set a time, also typically in numbers of T, between receipt of a write command by the memory and when the write data is provided to the memory. The latencies may be selected, for example, to accommodate clock signals of different frequencies (i.e., different clock periods).

Complicating the generating of correctly timed internal clock and command signals is the relatively high frequency of memory clock signals, such as 1 GHz or higher. For example, memory clock signals can exceed 1 GHz. Further complicating the matter is that multi-data rate memories may provide and receive data at a rate higher than the memory clock signal, which may represent the rate at which commands may be executed. As a result, command signals and an internal clock signal may need to be in sync in order to maintain proper timing. An example of a multi-data rate memory is one that outputs read data at a rate twice that of the clock frequency, such as outputting data synchronized with clock edges of the memory clock signal.

An example conventional approach of timing internal command and clock signals is modeling both the clock path and the command path to have the same propagation delay. This may require, however, that delays and/or counter circuitry run continuously. As a result, power consumption may be higher than desirable. Additionally, the propagation delay of the various internal clock and command paths can often vary due to power, voltage, and temperature conditions. For clock and command paths having relatively long propagation delay or additional delay circuitry, the variations due to operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
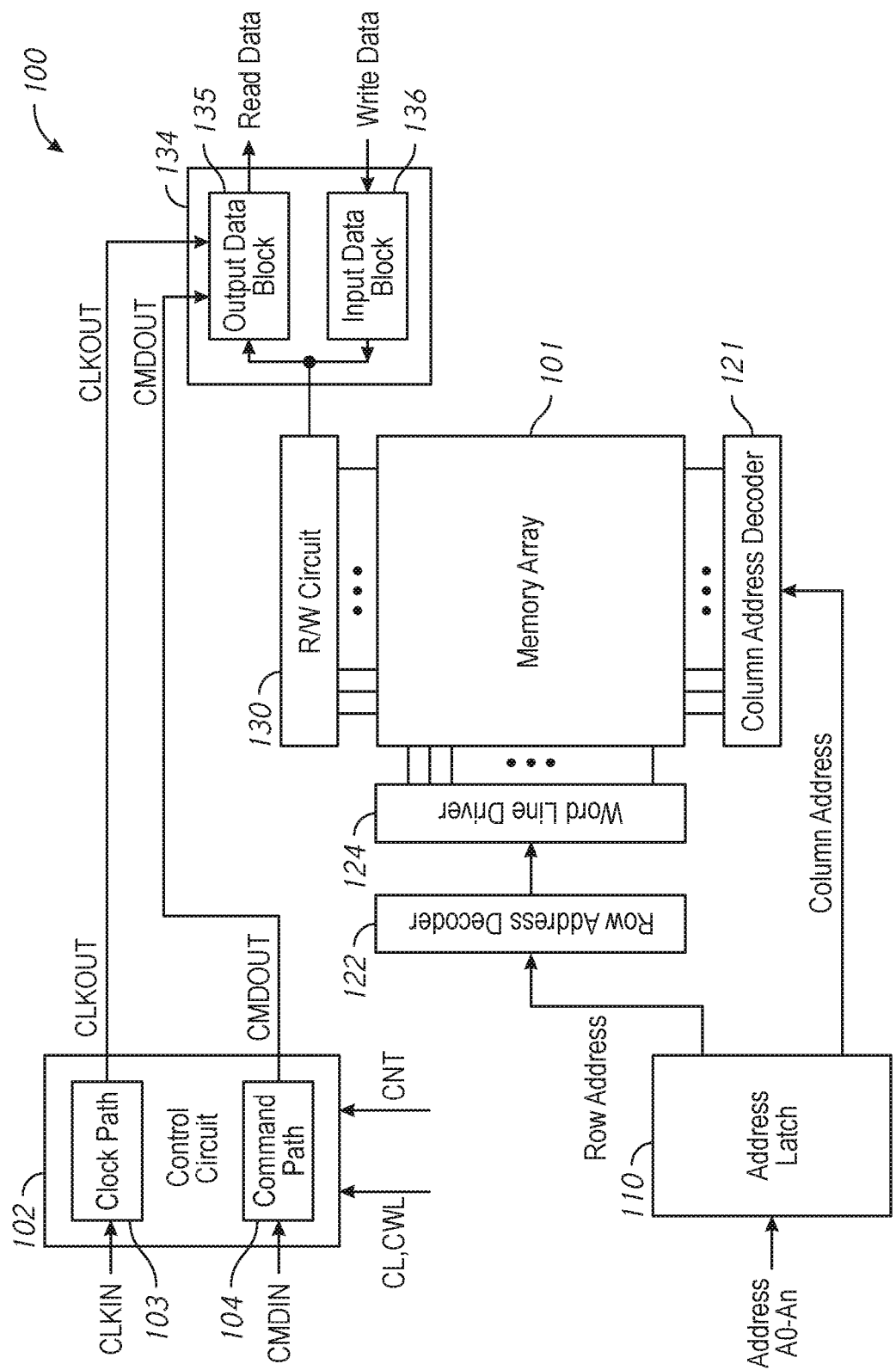
FIG. 1 is a block diagram of an apparatus including a command decoder in accordance with an embodiment of the present disclosure.

FIG. 1 is a block diagram of a portion of an apparatus 100 including a control circuit in accordance with an embodiment of the present disclosure. As used herein, an "apparatus" can refer to, for example, circuitry, a semiconductor die, a device, or a system. The apparatus 100 includes a memory array 101 of memory cells, which may be, for example, dynamic random access memory (DRAM) memory cells, static random access memory (SRAM) memory cells, flash memory cells, or some other types of memory cells. The apparatus 100 includes a control circuit 102 that receives memory commands and provides (e.g., generates) corresponding control signals within the apparatus 100 to execute various memory operations.

Row and column address signals are provided (e.g., applied) to the apparatus 100 via an address latch 110. The address latch captures the received address signals, and then provides a column address and a row address to a column address decoder 121 and a row address decoder 122, respectively. The column address decoder 121 selects bit lines extending through the memory array 101 corresponding to respective column addresses. The row address decoder 122 is coupled to a word line driver 124 that activates respective rows of memory cells in the memory array 101 corresponding to received row addresses. The selected data line (e.g., a bit line or bit lines) corresponding to a received column address are coupled to a read/write circuit 130 to provide read data to an input/output (I/O) data block 134. Write data are provided to the memory array 101 through the I/O data block 134 and the read/write circuit 130. The I/O data block 134 may include an output data block 135 and an input data block 136 that operate responsive to an internal clock signal CLKOUT and an internal command signal CMDOUT, for example. The output data block 135 may provide read data from the memory array 101, responsive to a command for read operations. In some embodiments, the output data block 135 may provide the read data responsive to the internal command signal CMDOUT. The input data block 136 may receive write data responsive to a command for write operations.

The control circuit 102 includes a clock path 103. The clock path 103 receives an external clock signal CLKIN and propagates an internal clock signal CLKOUT which is based at least in part on the external clock signal CLKIN to the I/O data block 134.

The control circuit 102 also includes a command path 104. The command path 104, which is shown in FIG. 1 as being included in the control circuit 102, but is not limited to such a configuration, provides the internal command signal CMDOUT to the I/O data block 134. The control circuit 102 responds to memory commands CMDIN to perform various operations on the memory array 101. In particular, the control circuit 102 is used to provide internal control signals to read data from and write data to the memory array 101. The command path 104 receives latency signals such as a CAS latency signal CL and a CAS write latency signal CWL. The command path 104 also receives internal clock signals from the clock path 103. The command path 104 may also receive an N value from a forward path measurement circuit, but is not limited to such a configuration, (not shown) which measures a forward path delay in number of clock cycles of one of the internal clock signals and provides the count N.

Figure 2:
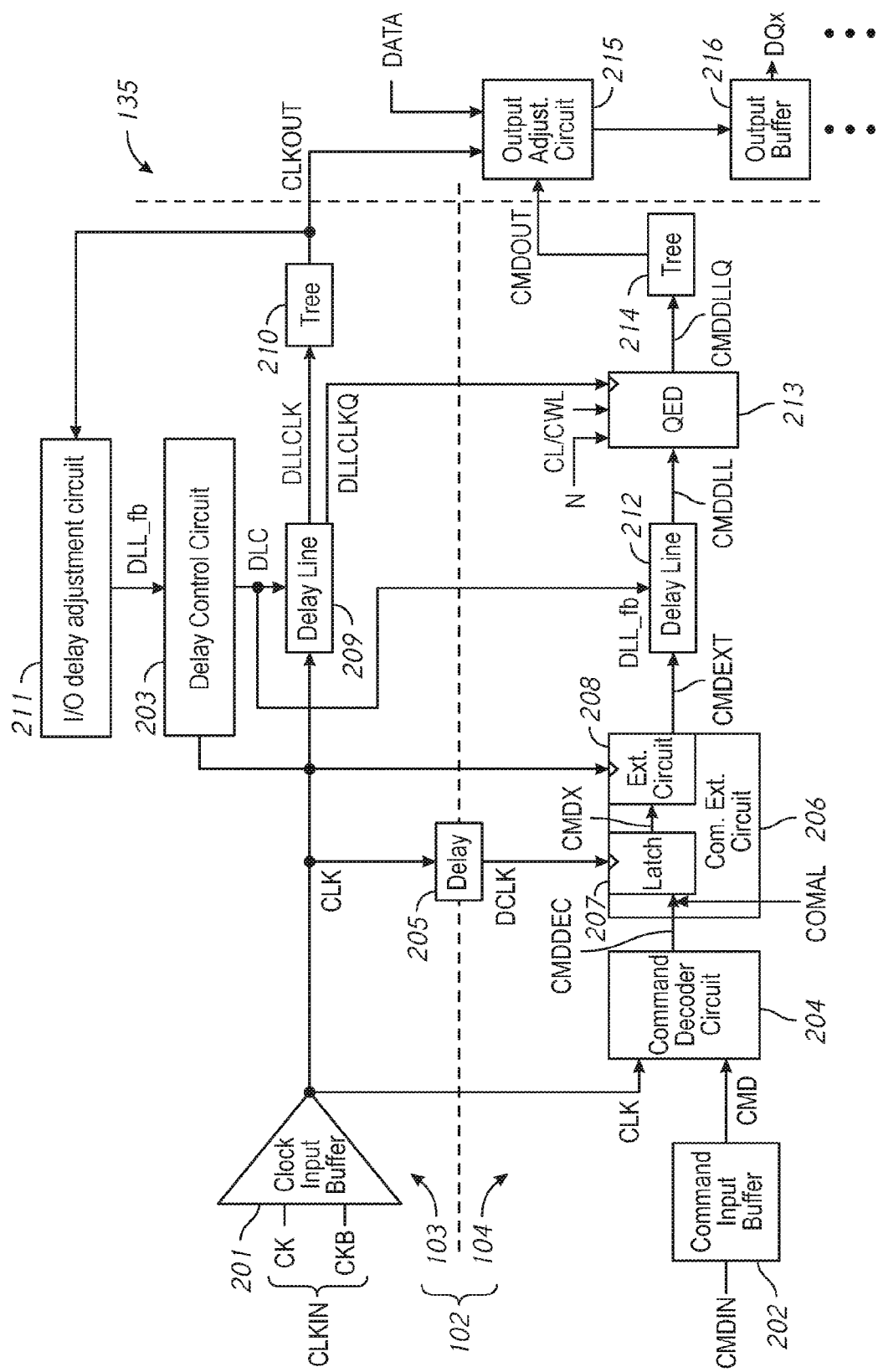
FIG. 2 is a block diagram of the command decoder of FIG. 1, in accordance with an embodiment of the present disclosure.

FIG. 2 is a block diagram of the control circuit 102 of FIG. 1, in accordance with an embodiment of the present disclosure. The control circuit 102 includes the clock path 103. The clock path 103 includes a clock input buffer 201. The clock input buffer 201 may receive a pair of complementary clock signals CK and CKB based on a clock signal CLKIN, for example, and provides a clock signal CLK. The CLK signal is transmitted to a delay line 209. The CLK signal may be transmitted to a command decoder circuit 204, a command extension circuit 206 on the command path 104. For example, the delay line 209 may be an adjustable delay line including a duty cycle controller (DCC), a coarse delay line and a fine delay line. An adjustable delay amount of the delay line 209 may be based on a delay control signal DLC which is provided by a delay line control circuit 203. The delay line control circuit 203 may provide the delay control signal DLC responsive to the CLK signal and a feedback delay signal DLL_fb. The delay line 209 may provide a clock signal DLLCLK to the clock path 103 by delaying the CLK signal by the adjustable delay amount. The delay line 209 may further provide a clock signal DLLCLKQ to the command path 104 by delaying the CLK signal by the adjustable delay amount. The clock path 103 may further include a tree 210 which receives the DLLCLK signal from the delay line 209 and provides a clock output signal CLKOUT. The CLKOUT signal is also provided to an I/O delay adjustment circuit 211. The I/O delay adjustment circuit 211 models delays caused by the clock input buffer 201 and an output buffer 216 in the output data block 135. The I/O delay adjustment circuit 211 further generates the DLL_fb signal based on the modeled delays and the CLKOUT signal. The I/O delay adjustment circuit 211 provides the DLL_fb signal to the delay line 209.

The command path 104 in the control circuit includes a command input buffer 202. The command input buffer 202 receives command signals CMDIN. The CMDIN signals may convey a memory access command, such as a read, write, or on die termination (ODT) command, indicative of instructing a read operation, a write operation or an on-die termination, respectively. The command input buffer 202 buffers the received command signals CMDIN and provides buffered command signals CMD to the command decoder circuit 204. The command decoder circuit 204 receives the CLK signal and the CMD signals. The command decoder circuit 204 decodes the CMD signals, responsive to the CLK signal to provide a pulse on a decoded command signal CMDDEC to the command extension circuit 206. The CMDDEC signal may be a read signal, a write signal or an ODT signal. The command extension circuit 206 may receive the CMDDEC signal and a command additive latency signal COMAL signal. The command extension circuit 206 may include a latch circuit 207. Based on the COMAL signal, the CMDDEC signal may be shifted and provided to the latch circuit 207. The latch circuit 207 also receives a delayed clock signal DCLK from a delay circuit 205. The delay circuit 205 receives the CLK signal, adds a delay ($D_{DCLK}$) to the CLK signal, and provides the DCLK signal. The latch circuit 207 may include a flip-flop which may latch the shifted CMDDEC signal responsive to the DCLK signal and may further provide an intermediate command signal CMDX. The command extension circuit 206 may further include an extension circuit 208. The extension circuit 208 receives the CMDX signal and generates a command extension signal CMDEXT that has a pulse width of multiple clock cycles of the CLK signal by lengthening the CMDX signal having a pulse width of one clock cycle (T) of the CLK signal. As will be described in more detail below, the extension circuit 208 provides the CMDEXT signal responsive to the CLK signal.

The command path 104 further includes a delay line 212 coupled to the command extension circuit 206. For example, the delay line 212 may be an adjustable delay line including a DCC, a coarse delay line and a fine delay line. In some embodiments, the delay line 212 has substantially the same circuit structure as the delay line 209. The CMDEXT signal is transmitted to the delay line 212. The delay line 212 may provide a delayed command signal CMDDLL responsive to the CMDEXT signal and further responsive to the DLC signal that is based on the CLK signal and the DLL_fb signal. The command path 104 further includes a dQ-Enable-Delay (QED) circuit 213. The QED circuit 213 receives a selected latency (e.g., a CL value and/or a CWL value), an N value. The QED circuit 213 may further receive the DLLCLKQ signal from the delay line 209. For a read operation, the DLLCLK signal and the DLLCLKQ signal are the same signal. For an on-die termination (ODT) function, the DLLCLK signal is stable and the DLLCLKQ signal provides a clock pulses, because termination information is common to all data queues (DQs), and a common ODT signal may be generated from DLLCLKQ at a root of the tree 210. The common ODT signal may be provided to all the DQs through a network similar to the tree 210. This may keep the ODT signal provided to the DQs synchronized with the CLKOUT signal at leaves of the tree 210. The latency may be defined by a number of clock cycles, for example, of the CLK signal. The N value may be a number of clock cycles equivalent to a delay between receipt of the CLK signal and the DLLCLKQ signal. The CL value is column address strobe (CAS) latency that may account for a delay time between when the apparatus receives the read command and when the output buffer 216 receives read data responsive to the read command based on the CLKOUT signal including time for data to be accessed and provided to an output bus (e.g., via a DQ pad after the output buffer 216). The CWL value is CAS write latency that may account for a delay time between when the apparatus receives the write command and when the input data block 136 in FIG. 1 receives write data responsive to the write command based on DQS signals (not shown) including time for data to be accessed and provided to an input bus (e.g., via a DQ pad before the input data block 136). The CL value and the CWL value may be represented as numbers of clock cycles of the CLK signal. The CL value and the CWL value may be frequency dependent value, for example.

The QED circuit 213 synchronizes the CMDDLL signal from the delay line 212 with the DLLCLKQ signal from the delay line 209, for example, by adjusting a latency (e.g., shifting) of the CMDDLL signal using the N value and the CL value or the CWL value. For example, in some embodiments, the QED circuit 213 may shift the CMDDLL signal for the read command responsive to the CL. In some embodiments, the QED circuit 213 may shift the CMDDLL signal for the write command or the ODT command responsive to the CWL. An adjustment factor may also be considered. For example, in some embodiments, the N value may be greater than or equal to nine. For example, in some embodiments, the CL value and the N value may have to satisfy the condition that a difference between the CL value and the N value (e.g., CL−N) is greater or equal to two. In some embodiments, the QED circuit 213 shifts the CMDDLL signal by (CL−(N+2)) clock cycles of the DLLCLKQ signal for read commands, where two is the adjustment factor.

In operation, a command represented by the CMDIN signal is provided to the command path 104 and propagated through the command input buffer 202, the command decoder circuit 204, the command extension circuit 206, the delay line 212, and the QED circuit 213. The QED circuit 213 adds clock cycles of the DLLCLKQ signal to the propagating CMDDLL signal to provide a resulting propagation delay for the command path 104 that will accommodate the selected latency. A tree 214 which receives the shifted CMDDLL signal (e.g., a CMDDLLQ signal) and provides an output signal CMDOUT from the command path 104. The CMDOUT signal is provided to an output adjustment circuit 215 in the output data block 135. The output adjustment circuit 215 provides an output signal which is latched data responsive to the CLKOUT signal based on the CMDOUT signal. For example, the output adjustment circuit 215 may include a timing control signal generator for determining timings of rising and falling edges of the output data and the ODT termination. For example, the output adjustment circuit 215 may include a parallel-serial converter which converts data of a plurality of bits read in parallel from the memory array 101 in FIG. 1 via the R/W circuit 130 to a set of serial data in an appropriate order based on the timings. The output buffer 216 receives the output signal and provides data to a data queue (e.g., DQx).

Figure 3:
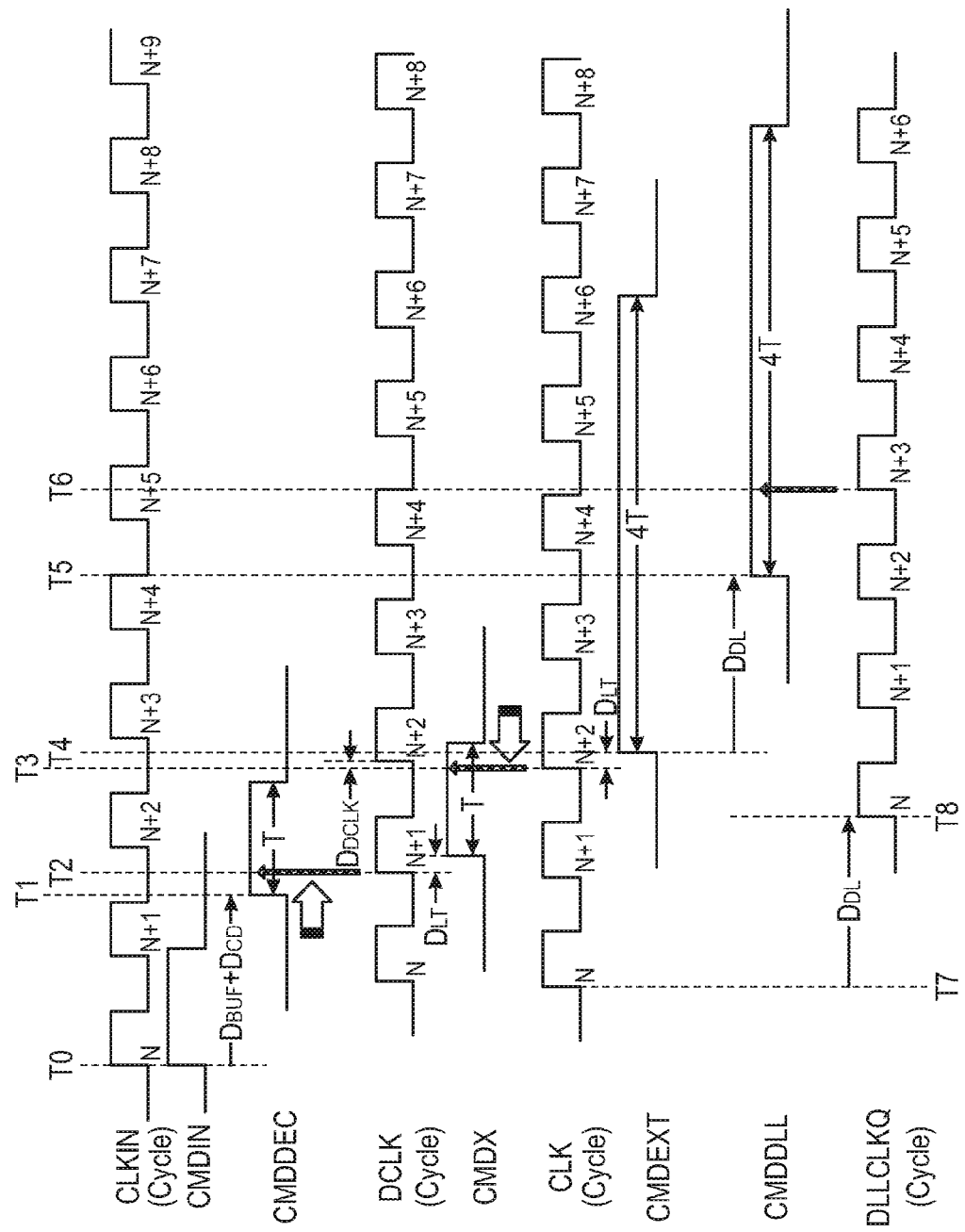
FIG. 3 is a timing diagram of various signals during operation of the command decoder of FIG. 2 in accordance with an embodiment of the present disclosure.

FIG. 3 is a timing diagram of various signals during operation of the control circuit 102 of FIG. 2 in accordance with an embodiment of the present disclosure. At time T0, the CMDIN signal becomes active, representing a memory command received by the command path 104 at a rising edge of a first pulse (N-pulse) of the CLKIN signal. After decoding the CMD signal responsive to the CMDIN signal with the CLK signal, the CMDDEC signal becomes active at time T1. The CMDDEC signal in FIG. 3 has a rising edge at time T1, which corresponds to the active CMDIN signal at time T0. The delay between times T0 and T1 represents a propagation delay $D_{BUF}$ of the CMDIN signal through the command input buffer 202 to be provided as the CMD signal and a propagation delay $D_{CD}$ of the CMD signal in the command decoder circuit 204 to be provided as the CMDDEC signal.

In the latch circuit 207 of the command extension circuit 206, the active CMDDEC signal is latched responsive to a rising edge of a second pulse (e.g., (N+1)-pulse) of the DCLK signal at time T2. The latch circuit 207 provides the CMDX signal with a propagation delay $D_{LT}$ between a clock input and a data output of the latch circuit 207. The CMDX signal in FIG. 3 has a rising edge after time T2 which is not latched by the second pulse (e.g., (N+1)-pulse) of the CLK signal at time T2. Instead, the CMDX signal may be latched by the third pulse (e.g., (N+2)-pulse) of the CLK signal at time T3. The CMDX signal is provided to the extension circuit 208. As will be described in more detail below, the extension circuit 208 provides the CMDEXT signal that has the pulse width of multiple clock cycles of the CLK signal by lengthening the CMDX signal having the pulse width of one clock cycle (T) of the CLK signal and a propagation delay $D_{LT}$, responsive to the CLK signal. For example, the CMDEXT signal may have the pulse width of four clock cycles (4T) as shown in FIG. 3. The CMDEXT signal may become active at time T4 responsive to the third pulse (e.g., (N+2)-pulse) of the CLK signal at time T3.

The CMDEXT signal propagates through the delay line 212 to provide the CMDDLL signal while the CLK signal propagates through the delay line 209 to provide the DLL-CLKQ signal. The delay line 212 and the delay line 209 provide the same delay $D_{DL}$. The DLLCLKQ has a rising edge of an N-pulse at T8 which is delayed by the delay $D_{DL}$ from a rising edge of an N-pulse of the CLK signal at time T7. A rising edge at T5 of the CMDDLL signal has the delay $D_{DL}$ relative to a rising edge of the CMDEXT signal time T4. The CMDDLL signal may have an extended pulse width (e.g., 4T) after the CMDEXT signal. The QED circuit 213 receives the CMDDLL signal and the DLLCLKQ signal. To capture a rising edge of the CMDDLL signal, the DLL-CLKQ signal is used. As shown in FIG. 3, the active CMDDLL signal is captured responsive to a rising edge of an (N+3)-pulse of the DLLCLKQ signal at time T6. The QED circuit 213 may provide the CMDDLLQ signal by providing a propagation delay to the CMDDLL signal in order to adjust based on the selected latency (e.g., (CL−(N+2))). For example such as shifting the CMDDLL signal by (CL−(N+2)) clock cycles of the DLLCLKQ signal for read commands, where two is the adjustment factor.

Figure 4:
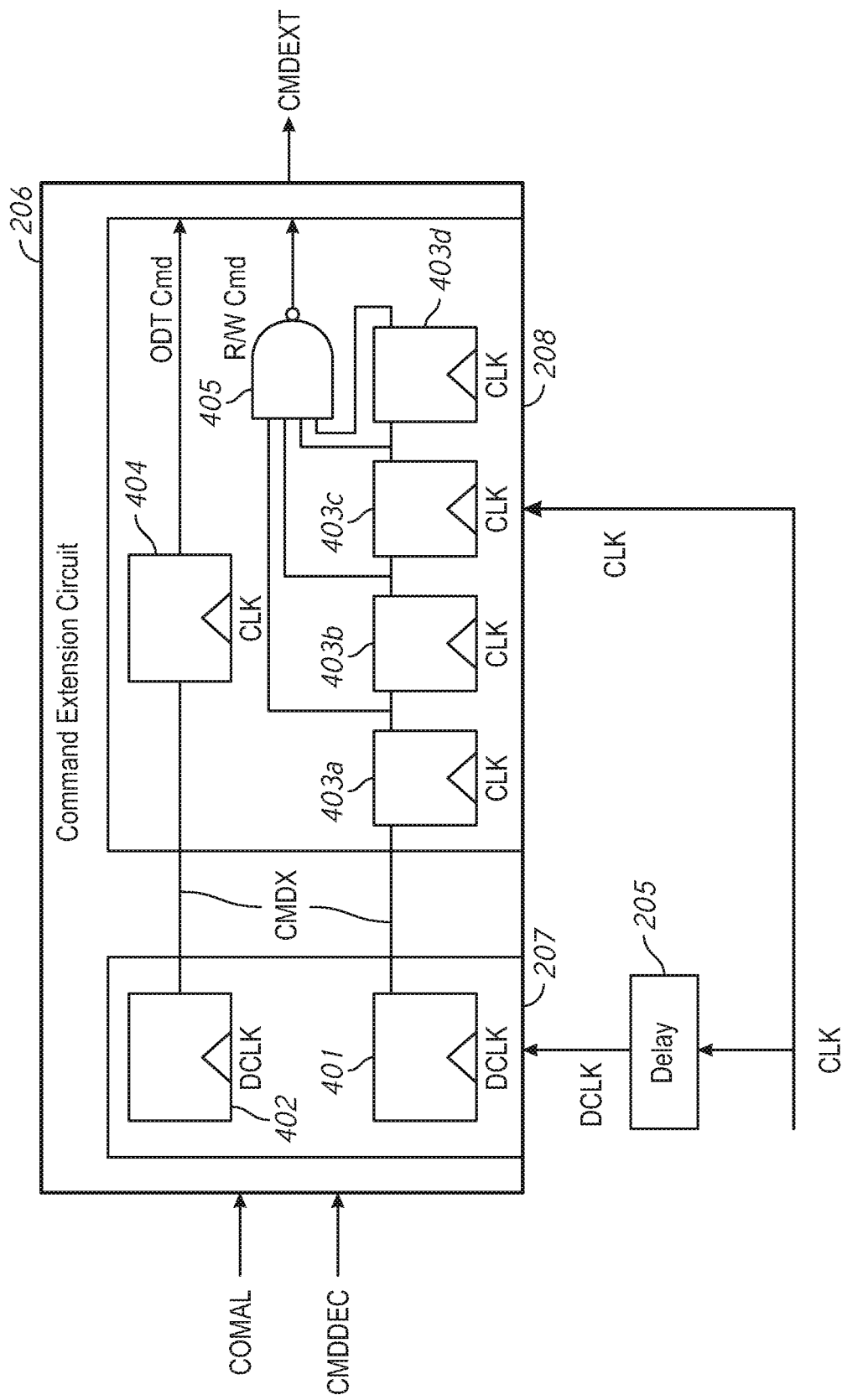
FIG. 4 is a block diagram of a command extension circuit in the command decoder of FIG. 2 in accordance with an embodiment of the present disclosure.

FIG. 4 is a block diagram of a command extension circuit in the control circuit of FIG. 2 in accordance with an embodiment of the present disclosure. For example, the command extension circuit 206 may include a latch circuit 207. The latch circuit 207 may receive the CMDDEC signal and a command additive latency signal COMAL signal. The command additive latency COMAL signal may represent additive latency which allows a read command or a write command to be issued immediately following an active command. The CMDDEC signal may be a read signal, a write signal or an ODT signal. The latch circuit 207 may also receive the delayed clock signal DCLK from the delay circuit 205. As previously described, the delay circuit 205 receives the CLK signal, and may add a delay $D_{DCLK}$ to the CLK signal, and provides the DCLK signal. The latch circuit may include a latch 401 for a command for operations, such as a read command or write command and a latch 402 for an ODT command. The latch 401 may be a flip-flop which may latch the shifted CMDDEC signal representing either the read command signal or the write signal responsive to the DCLK signal. The latch 402 may be a flip-flop which may latch the shifted CMDDEC signal representing the ODT command responsive to the DCLK signal. The CMDDEC signal latched by the DCLK signal is provided as an intermediate command signal CMDX.

The command extension circuit 206 may further include the extension circuit 208. The extension circuit 208 may include a plurality of flip-flops 304 and a multiplexer 405. For example, the number of the plurality of flip-flops 403*a*, 403*b*, 403*c*, and 403*d* may be four in FIG. 4. For the read operation or the write operation, the extension circuit 208 receives the CMDX signal having a pulse width of one clock cycle T at a flip-flop 403*a*. In one example, the CMDX signal may include a positive pulse when the multiplexer 405 is an OR gate. In another example, the CMDX signal may include a negative pulse when the multiplexer 405 is a NAND gate. Each of the plurality of flip-flops 403*a*, 403*b*, 403*c*, and 403*d* may provide a delay having a length of the one clock cycle T to the CMDX signal associated with a respective latency. The flip-flop 403*a* receives the CMDX signal and the CLK signal and provides a first delayed CMDX signal. The flip-flop 403*b* has a data input that receives the first delayed CMDX signal and a clock input that receives the CLK signal, and further provides a second delayed CMDX signal. The flip-flop 403*c* has a data input that receives the second delayed CMDX signal and a clock input that receives the CLK signal, and further provides a third delayed CMDX signal. The flip-flop 403*d* has a data input that receives the third delayed CMDX signal and a clock input that receives the CLK signal, and further provides a fourth delayed CMDX signal. The multiplexer 405 may receive the first delayed CMDX signal, the second delayed CMDX signal, the third delayed CMDX signal, and the fourth delayed CMDX signal, and may further provide the CMDEXT signal responsive to the read command or the write command. Thus, the extension circuit 208 may generate the CMDEXT signal having the pulse width of multiple clock cycles of the CLK signal by delaying the CMDX signal having a pulse width of one clock cycle (T) of the CLK signal by the plurality of flip-flops 403*a*, 403*b*, 403*c*, and 403*d* and multiplexing the delayed CMDX signals from the plurality of the flip-flops 403*a*, 403*b*, 403*c*, and 403*d* by the multiplexer 405. The extension circuit 208 may also include a flip-flop 404 which may latch the CMDX signal representing the ODT command responsive to the CLK signal and may further provide a signal responsive to the ODT command as the CMDEXT signal. For example, in some embodiments, the flip-flop 404 may synchronize the CMDX signal provided by the flip-flop 402 with the CLK signal without extending a pulse width of the CMDX signal. As a result, the extension circuit 208 provides the CMDEXT signal responsive to the CLK signal.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a command input buffer configured to receive command signals and further configured to provide buffered command signals;
   a command decoder coupled to the command input buffer, configured to decode the buffered command signals responsive, at least in part, to a first clock signal and further configured to provide a decoded command signal; and
   a command extension circuit coupled to the command decoder, configured to receive the decoded command signal responsive, at least in part, to a second clock signal having a first delay relative to the first clock signal, and further configured to provide a command extension signal responsive, at least in part, to the first clock signal, the command extension signal having a pulse width longer than the pulse width of the decoded command signal.

2. The apparatus of claim 1, further comprising a delay circuit configured to receive the first clock signal and further configured to provide the second clock signal;
   wherein the command extension circuit comprises:
   a latch circuit configured to latch the decoded command signal with the second clock signal and further configured to provide an intermediate command signal; and
   an extension circuit coupled to the latch circuit, configured to latch the intermediate command signal with the first clock signal, and further configured to provide the command extension signal.

3. The apparatus of claim 2, further comprising:
   a first delay line configured to receive the first clock signal and further configured to provide a third clock signal having a third delay relative to the first clock signal;
   a second delay line coupled to the command extension circuit and configured to provide a delayed command signal having the third delay relative to the command extension signal; and
   a dQ-Enable-Delay (QED) circuit coupled to the first delay line and the second delay line, configured to receive the delayed command signal and the third clock signal and further configured to synchronize the delayed command signal with the third clock signal.

4. The apparatus of claim 3, further comprising a clock input buffer configured to receive a fourth clock signal and further configured to provide the first clock signal,
   wherein the command input buffer is configured to receive the command signals at a first edge of a first pulse of the fourth clock signal,
   wherein the latch circuit is configured to latch the decoded command signal at a first edge of a second pulse of the second clock signal corresponding to a first edge of a second pulse of the fourth clock signal successive to the first pulse of the fourth clock signal,
   wherein the extension circuit is configured to latch the intermediate command signal at a first edge of a second pulse of the first clock signal corresponding to the first edge of the second pulse of the fourth clock signal, further configured to provide the command extension signal responsive, at least in part, to a first edge of a third pulse of the first clock signal corresponding to a first edge of a third pulse of the fourth clock signal successive to the second pulse of the fourth clock signal, and wherein the QED circuit is configured to latch the delayed command signal at a first edge of a fourth pulse of the third clock signal corresponding to a first edge of a fourth pulse of the fourth clock signal successive to the third pulse of the fourth clock signal.

5. The apparatus of claim 1, wherein the pulse width of the decoded command signal is one clock cycle of the first clock signal; and wherein the pulse width of the command extension signal is multiple clock cycles of the first clock signal.

6. The apparatus of claim 2, wherein the extension circuit comprises:

a first flip-flop configured to receive the intermediate command signal and the first clock signal and further configured to provide a first delayed intermediate command signal;

a second flip-flop configured to receive the first delayed intermediate command signal and the first clock signal and further configured to provide a second delayed intermediate command signal; and a multiplexer configured to receive the first delayed intermediate command signal and the second delayed intermediate command signal, and further configured to provide the command extension signal.

7. The apparatus of claim 6, wherein the second delayed intermediate command signal has a second delay relative to the first delayed intermediate command signal that is equal to one clock cycle of the first clock signal.

8. The apparatus of claim 6, wherein the intermediate command signal includes a positive pulse, and wherein the multiplexer is an OR gate.

9. The apparatus of claim 6, wherein the intermediate command signal includes a negative pulse, and wherein the multiplexer is an NAND gate.

10. A method comprising:

decoding buffered command signals responsive, at least in part, to a first clock signal to provide a decoded command signal;

delaying the first clock signal to provide a second clock signal having a first delay relative to the first clock signal;

latching the decoded command signal with the second clock signal;

providing an intermediate command signal responsive, at least in part, to latching the decoded command signal; and extending a pulse width of the intermediate command signal responsive, at least in part, to the first clock signal to provide a command extension signal having a pulse width greater than one clock cycle of the first clock signal.

11. The method of claim 10, further comprising:

delaying the first clock signal to provide a third clock signal having a second delay relative to the first clock signal; and synchronizing the command extension signal with the third clock signal.

12. The method of claim 11, wherein extending the pulse width of the intermediate command signal comprises:

shifting the intermediate command signal responsive, at least in part, to the first clock signal to provide a first delayed intermediate command signal and a second delayed intermediate command signal; and multiplexing the first delayed intermediate command signal and the second delayed intermediate command signal to provide the command extension signal.

13. The method of claim 11, further comprising:

receiving a fourth clock signal at a clock input buffer; and providing the first clock signal by the clock input buffer, wherein command signals are received at command input buffer at a first edge of a first pulse of the fourth clock signal to provide the buffered command signal;

wherein the decoded command signal is latched at a first edge of a second pulse of the second clock signal corresponding to a first edge of a second pulse of the fourth clock signal successive to the first pulse of the fourth clock signal, wherein the intermediate command signal is latched at a first edge of a second pulse of the first clock signal corresponding to the first edge of the second pulse of the fourth clock signal, and wherein the command extension signal is provided responsive, at least in part, to a first edge of a third pulse of the first clock signal corresponding to a first edge of a third pulse of the fourth clock signal successive to the second pulse of the fourth clock signal.

14. The method of claim 10, wherein synchronizing the command extension signal with the third clock signal comprises adjusting first latency of the command extension signal.

15. The method of claim 14, wherein the first latency of the command extension signal is adjusted such that a first value representing latency between receipt of the first clock signal and the third clock signal in a number of clock cycles of the first clock signal becomes greater or equal to a first predetermined number.

16. The method of claim 14, wherein the first latency of the command extension signal is adjusted such that a difference between the first value and a second value representing column address strobe (CAS) latency in a number of clock cycles of the first clock signal becomes greater or equal to a second predetermined number.

17. The method of claim 10, wherein providing the intermediate command signal further comprises adding additive latency to the decoded command signal based on a command additive latency signal.

18. An apparatus comprises:

a clock path comprising a first delay line configured to receive a first clock signal and further configured to provide a third clock signal having a third delay relative to the first clock signal; and a command path, comprising:

a command input buffer configured to receive command signals and further configured to provide buffered command signals;

a command decoder circuit coupled to the command input buffer and configured to decode the buffered command signals responsive, at least in part, to the first clock signal and further configured to provide a decoded command signal;

a command extension circuit coupled to the command decoder circuit, configured to receive the decoded command signal, the first clock signal and a second clock signal having a first delay relative to the first clock signal, and further configured to provide a command extension signal having a pulse width longer than the pulse width of the decoded command signal;

a second delay line coupled to the command extension circuit and configured to provide a delayed command signal having the third delay relative to the command extension signal; and a dQ-Enable-Delay (QED) circuit coupled to the first delay line and the second delay line, configured to receive the delayed command signal and the third clock signal and further configured to synchronize the delayed command signal with the third clock signal.

19. The apparatus of claim 18, wherein the command path further comprises a delay circuit configured to receive the first clock signal and further configured to provide the second clock signal, and wherein the command extension circuit comprises:

a latch circuit configured to latch the decoded command signal with the second clock signal and further configured to provide an intermediate command signal; and an extension circuit coupled to the latch circuit, configured to latch the intermediate command signal with the first clock signal, and further configured to provide the command extension signal.

20. The apparatus of claim 19, wherein the clock path further comprises a clock input buffer configured to receive a fourth clock signal and further configured to provide the first clock signal, wherein the command input buffer is configured to receive the command signals at a first edge of a first pulse of the fourth clock signal, wherein the latch circuit is configured to latch the decoded command signal at a first edge of a second pulse of the second clock signal corresponding to a first edge of a second pulse of the fourth clock signal successive to the first pulse of the fourth clock signal, wherein the extension circuit is configured to latch the intermediate command signal at a first edge of a second pulse of the first clock signal corresponding to the first edge of the second pulse of the fourth clock signal, further configured to provide the command extension signal responsive, at least in part, to a first edge of a third pulse of the first clock signal corresponding to a first edge of a third pulse of the fourth clock signal successive to the second pulse of the fourth clock signal, and wherein the QED circuit is configured to latch the delayed command signal at a first edge of a fourth pulse of the third clock signal corresponding to a first edge of a fourth pulse of the fourth clock signal successive to the third pulse of the fourth clock signal.

* * * * *